United States Patent [19]
Shimoyama et al.

[11] Patent Number: 5,691,536
[45] Date of Patent: Nov. 25, 1997

[54] PHOTO-DETECTOR HAVING A UNIFORM OUTPUT CHARACTERISTIC AND FABRICATING METHOD THEREFOR

[75] Inventors: Masaki Shimoyama, Kusatsu; Shuichi Kodama, Otsu; Kazuhiro Kondo, Katano, all of Japan

[73] Assignee: Matsushita Electric Industrial Co., Ltd., Osaka-Fu, Japan

[21] Appl. No.: 454,056

[22] Filed: May 30, 1995

[30] Foreign Application Priority Data

Jun. 3, 1994 [JP] Japan .................. 6-122461

[51] Int. Cl.$^6$ .................. G01J 1/00; H01L 31/0232
[52] U.S. Cl. .................. 250/239; 250/214.1; 250/216; 257/432; 437/8
[58] Field of Search .................. 250/214.1, 214 R, 250/208.1, 208.2, 216, 226, 239; 437/2, 3, 5, 8, 51, 209, 214, 219; 257/432, 433, 434

[56] References Cited

U.S. PATENT DOCUMENTS

| Re. 35,069 | 10/1995 | Hallenbeck et al. | 250/239 |
| 4,182,977 | 1/1980 | Stricklin, Jr. | 250/239 |
| 4,309,605 | 1/1982 | Okabe | 250/239 |
| 5,233,178 | 8/1993 | Tokunaga | 250/239 |
| 5,289,002 | 2/1994 | Tarn | 250/239 |
| 5,329,131 | 7/1994 | Wijdenes et al. | 250/239 |

Primary Examiner—Edward P. Westin
Assistant Examiner—John R. Lee
Attorney, Agent, or Firm—Panitch Schwarze Jacobs & Nadel, P.C.

[57] ABSTRACT

In a photo-detector, a window pane member for covering a photosensitive semiconductor is selected from among plural samples having light transmittances different from each other in compliance with an intensity of output of the photosensitive semiconductor detected under a constant quantity of light incident on the photosensitive semiconductor, thereby compressing dispersion of outputs in the plural photo-detectors into a small range as a whole.

2 Claims, 7 Drawing Sheets

PHOTO-DETECTOR HAVING A UNIFORM OUTPUT CHARACTERISTIC AND FABRICATING METHOD THEREFOR

FIELD OF THE INVENTION AND RELATED ART STATEMENT

1. Field of the Invention

The present invention relates to a photo-detector employed in a visible light sensor and an infrared ray sensor etc. which are used to control an apparatus and to measure environmental conditions of light.

2. Description of the Related Art

According to the publication of the unexamined Japanese utility model application (Jikkai sho) 63-200733, the photo-detector as aforementioned is classified into the following four types in terms of construction how an incident light enters a photosensitive semiconductor:

(A) a housing type wherein glass and metal are fused to bond with each other;

(B) a resin casing type;

(C) a resin coated type; and (D) a resin molded type.

FIG. 1 is a cross-sectional view showing the photo-detector 100 which is similar to the prior art of the type (A). In FIG. 1, a lead 3 is fixed to a conductive base member 1 with a glass member 2 put therebetween through the hermetic sealing process. A photosensitive semiconductor 4 is mounted on the base member 1. The photosensitive semiconductor 4 and the lead 3 are electrically connected with each other via a gold wire 5. A metal cap member 6 is mounted on the base member 1 to surround an upper peripheral part thereof. A window pane member 7 made of plastic or glass is fit into an upper opening part of the metal cap member 6. Another lead 8 is directly connected to the base member 1.

The photo-detector of the type (B) has a resin case instead of both the metal cap member 6 and the window pane member 7 of the above-mentioned type (A).

The photo-detector of the type (C) has a resin coating on a photosensitive semiconductor 4 instead of both the metal cap member 6 and the window pane member 7 of the type (A).

The photo-detector of the type (D) has a photosensitive semiconductor molded within a resin member.

In the above-mentioned photo-detectors of any type, output currents of the photo-detector vary in the range of ±20% to ±40% of a mean value thereof even though the photo-detector receives lights of same amount since the photosensitive semiconductors generally have considerable dispersion in their sensitivities.

One of the reason why there exists the dispersion of output currents of the photo-detectors is that there is irregularity of material constituting the photo-detector. The other reason is that manufacturing processes could not perfectly exclude lack of uniformity in producing the photosensitive semiconductors.

However, it is difficult to perfectly remove irregularity in producing an ingots of the photosensitive semiconductor 4. Also, it is difficult to perfectly remove irregularity in producing the photosensitive semiconductors.

Therefore, to suppress irregularity of output current values of the photo-detectors, it has been required that a limited number of suitable photosensitive semiconductors must be selected from many products by due observation of output-current-characteristics of respective photosensitive semiconductors. This means that many unselected photosensitive semiconductors each having an output-current-characteristic deviating from the specific characteristic can not be employed for assembling the photo-detectors. As a result, number of the actually employed photosensitive semiconductors is only a fraction of the produced photosensitive semiconductors. In other words, a production yield is very low. A manufacturing cost of the photosensitive semiconductor is extremely increased accordingly.

If a photo-detector having a rather great irregularity of its output current is employed as a sunshine sensor for an automatic air conditioner for controlling an air conditioner of an automobile, irregularity of factors to be controlled in an automatic air conditioning process by the sunshine sensor becomes large, and thereby comfortable air conditioning can not be realized.

With regard to the photo-detectors of the types (B) through (D), explanation will be made in relation to the construction of the present invention.

OBJECT AND SUMMARY OF THE INVENTION

An object of the present invention is to provide photo-detectors with a precisely uniform output characteristic by suppressing dispersion of output currents and a method for fabricating the photo-detector.

To achieve the above-mentioned object, a photo-detector of the present invention comprises:

a photosensitive semiconductor;

a pair of leads electrically connected to said photosensitive semiconductor; and a light-transmitting member provided in front of a light-receiving face of said photosensitive semiconductor, said light-transmitting member being selected from among plural light-transmitting members having light transmittances different from each other in compliance with an intensity of output of said photosensitive semiconductor detected under a predetermined quantity of light incident on said photosensitive semiconductor.

Also, a method for fabricating a photo-detector in the present invention comprising the step of:

mounting a photosensitive semiconductor on base means and making electrical connection with a pair of leads;

preparing a plurality of light-transmitting members having light transmittances different from each other;

measuring intensity of output of said photosensitive semiconductor under a predetermined quantity of light incident on said photosensitive semiconductor;

selecting one of said light-transmitting members in compliance with said intensity of output of the photosensitive semiconductor; and disposing said one of the light-transmitting members to cover said photosensitive semiconductor.

According to the present invention, it is possible to restrict dispersion of outputs of the photo-detectors within a small range without individually suppressing dispersion of outputs of the photosensitive semiconductors. Therefore, the photo-detectors having a uniform output characteristic can be offered, and it is thereby possible to precisely control apparatuses and measure optical conditions of environment where the photo-detector is used. When the photo-detector of the present invention is employed for a sunshine sensor for controlling an air conditioner in an automobile, temperature control is very precisely carried out based on a uniform output characteristic of the photo-detector.

While the novel features of the invention are set forth particularly in the appended claims, the invention, both as to organization and content, will be better understood and appreciated, along with other objects and features thereof, from the following detailed description taken in conjunction with the drawings.

It will be recognized that some or all of the Figures are schematic representations for purposes of illustration and do not necessarily depict the actual relative sizes or locations of the elements shown.

DESCRIPTION OF THE PREFERRED EMBODIMENTS

Hereafter, preferred embodiments of the present invention will be described with reference to the accompanying drawings.

Figure 1:
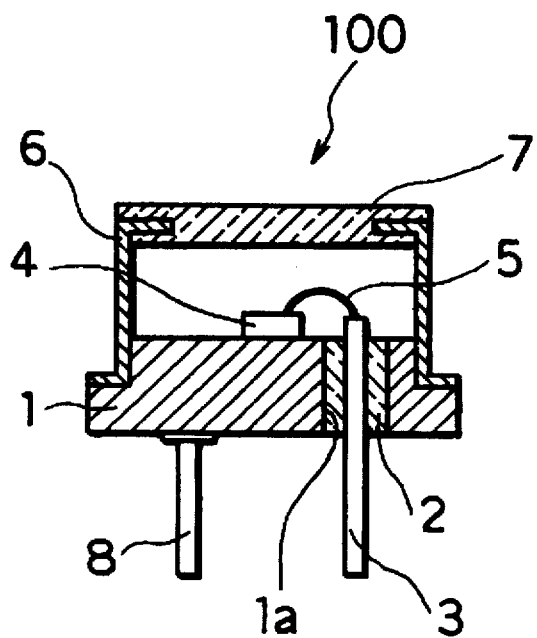
FIG. 1 is a cross-sectional view showing a photo-detector of a housing type.

FIG. 1 is a cross-sectional view showing a housing type (i.e., type (A)) photo-detector 100.

In FIG. 1, a photosensitive semiconductor 4 is bonded on the center part of a conductive base member 1 by means of a conductive adhesive etc. A lead 3 is inserted in a through-hole 1a formed in the base member 1 and is fixedly held by a glass member 2 formed through the hermetic sealing process. The lead 3 and the base member 1 are electrically insulated from each other. The photosensitive semiconductor 4 and the lead 3 are electrically connected with each other via a gold wire 5. A lead 8 is directly connected to the base member 1. A metal cap member 6 is mounted on the base member 1 to surround an upper peripheral part thereof. A window pane member 7 is fit into an upper opening part of the metal cap member 6 to thereby have a position in front of a light-receiving face of the photosensitive semiconductor 4.

The window pane member 7 consists of glass or plastic including a material such as carbon for limiting transmission of light. For instance, it is the mixture of a first polycarbonate L-1225Z (Teijin Limited, Japan) of black (type FR-70514) and a second polycarbonate L-1225Z of natural color. By varying a mixture ratio of the first polycarbonate and the second polycarbonate, a light transmittance of the window pane member 7 can be varied.

Figure 10:
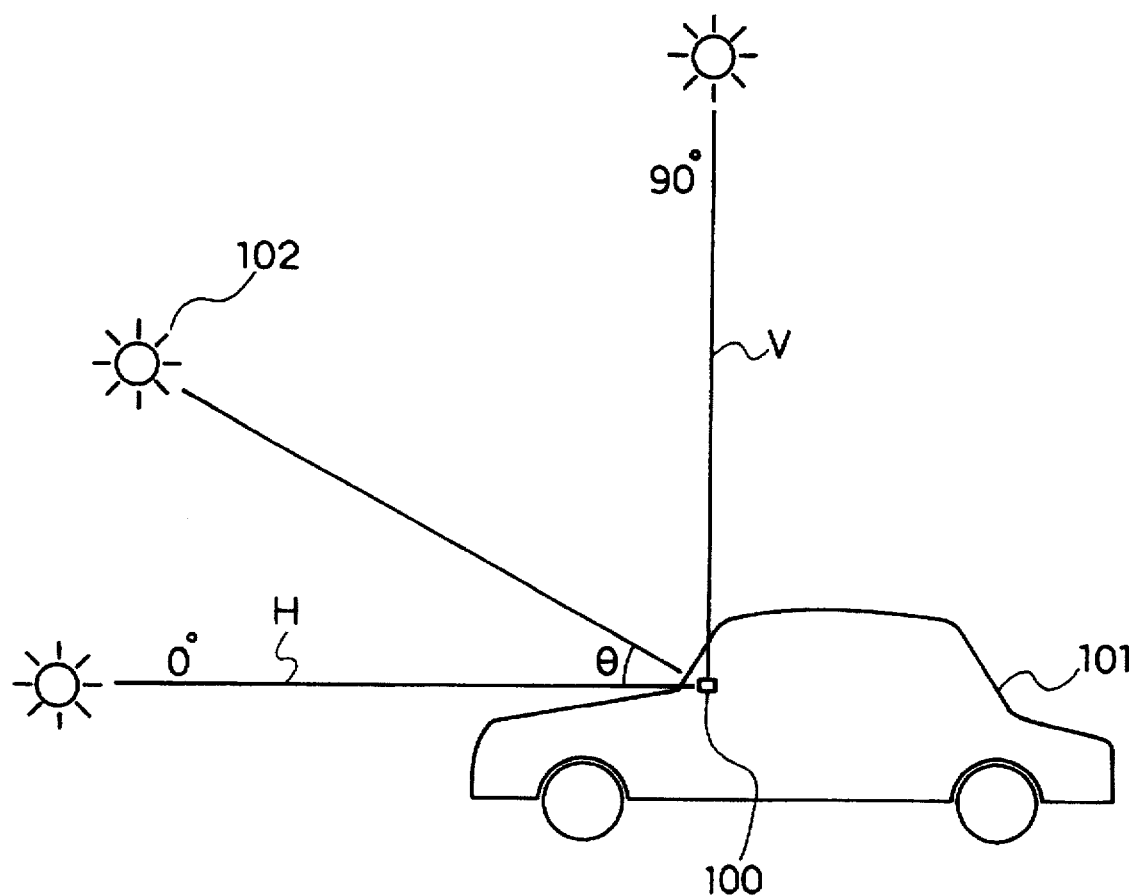
FIG. 10 is an illustration showing an automobile in which a photo-detector is mounted.

FIG. 10 is an illustration showing an automobile 101 in which the photo-detector 100 is mounted on a dashboard. In FIG. 10, angle of the sun 102 seen from the photo-detector 100 is defined to take values ranging from 0° (i.e., the horizontal line H) to 90° (i.e., the vertical line V). To simulate this positional relationship between the photo-detector 100 and the sun 102, the inventors have made experiments to observe a characteristic of output intensity of the photo-detector 100 versus variation of the angle of a light source when a halogen light (800 W) is used instead of the sun 102.

Figure 11:
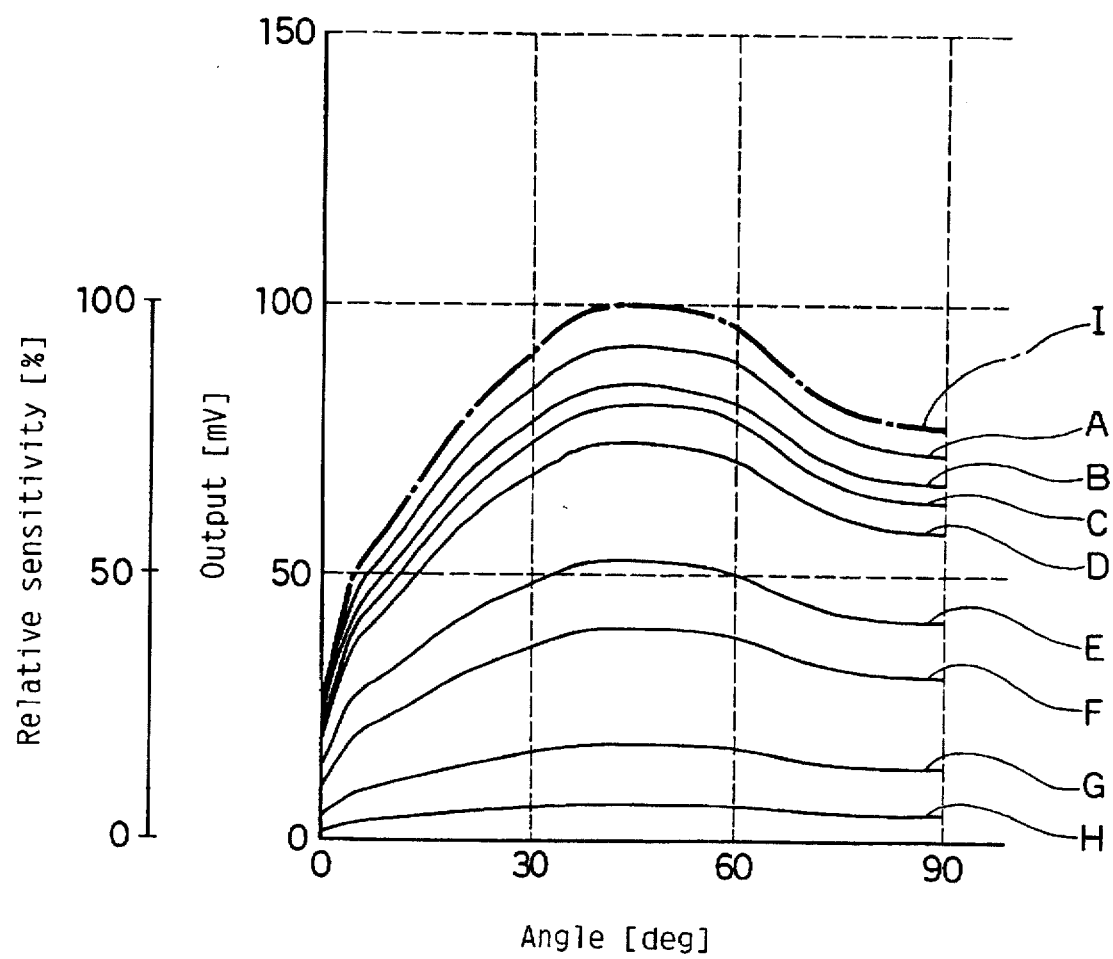
FIG. 11 is a graph showing output characteristics of the photo sensor.

FIG. 11 is a graph showing output characteristics of the photo-detector with respect to the angle of the light source as defined in FIG. 10. A curve "A" was obtained when no window pane member 7 (FIG. 1) is provided so as to directly irradiate the photosensitive semiconductor 4 (FIG. 1). Curves "B" to "H" were obtained when seven kinds of the window pane members 7 having respective light transmittances different from each other were disposed above the photosensitive semiconductor 4. The light transmittance of the window pane member 7 gradually decreases in compliance with the sequential order from "B" to "H". The photo-detector 100 has an output resistor (200Ω) connected thereto, and an output of the photo-detector 100 is detected as a voltage [mV] appearing between both ends of the resistor. As is apparent from the figure, output levels of the photo-detector gradually lower in response to decrease of the light transmittance, and a shape of the curve becomes gentle in response thereto. The maximum output values $V_{max}$ of the respective curves A–H are shown in the following table.

| Curve | A | B | C | D | E | F | G | H |
|---|---|---|---|---|---|---|---|---|
| $V_{max}$[mV] | 92.5 | 85.2 | 81.3 | 74.3 | 52.4 | 39.9 | 18.0 | 6.8 |

When a relative sensitivity Sr is defined with respect to respective curves by the following relation:

$$Sr = (V/V_{max}) \times 100 \ [\%],$$

a curve I, which is approximately common curve with respect to the curves A–H, is obtained as shown in FIG. 11. That is, relative sensitivity characteristics are substantially uniform even when the light transmittances vary. This is the ground that a concept of selecting the window pane member 7 having a suitable light transmittance can be employed.

Hereafter, selection of the window pane member 7 (FIG. 1) will be described. First, the photo-detector 100 is pre-assembled only except fitting-up steps of the metal cap 6 and the window pane member 7. Next, the photosensitive semiconductor 4 is irradiated by a light source (not shown) for emitting a constant quantity of light. For example, a standard tungsten bulb having a color temperature of 2856° K. is employed, and a quantity of light of 1000 [lx] is directly given to the photosensitive semiconductor 4 of 3.5 mm×3.5 mm square chip. Then, an output current of the photosensitive semiconductor 4 is measured to be 63.5 μA ±15%. Therefore, measured values are scattered in a range of 54 to 73 μA. Then, the range from 54 to 73 μA is assumed to be four small ranges equally divided. That is, the first range is from 54 to 58.75; the second range is from 58.75 to 63.50; the third range is from 63.50 to 68.25; and the fourth range is from 68.25 to 73.

several window pane members 7, which have different transmittances from each other, have been prepared beforehand. When the output current is within the above-mentioned fourth range, the window pane member 7 having a light transmittance for making the output level of the fourth range to the level of the first range is selected. That is, to reduce a mean value (70.625 μA) of the fourth range (68.25 to 73 μA) into a mean value (56.375 μA) of the first range (54 to 58.75 μA), the window pane member having a light transmittance for reducing the output into 56.375/70.625 (≈80[%]) is selected.

When the output current is within the third range, the window pane member 7 having a light transmittance for making the output level of the third range to the level of the first range is selected. That is, to reduce a mean value (65.875 μA) of the third range (63.5 to 68.25 μA) into the mean value (56.375 μA) of the first range (54 to 58.75 μA), the window pane member having a transmittance for reducing the output into 56.375/65.875 (≈86[%]) is selected.

When the output current is within the second range, the window pane member 7 having a light transmittance for making the output level of the second range to the level of the first range is selected. That is, to reduce a mean value (61.125 μA) of the second range (58.75 to 63.5 μA) into the mean value (56.375 μA) of the first range (54 to 58.75 μA), the window pane member having a light transmittance for reducing the output into 56.375/61.125 (≈92[%]) is selected.

When the output current is within the first range, the window pane member having a light transmittance of approximately 100% is selected. Thus, even when the crude outputs of the respective photosensitive semiconductors are not constant, the output of the photo-detector, whose assembly has been completed, is always limited to values within the first range of 54 to 58.75 μA (=56.375 μA ±4.2%) by selecting the window pane member having the suitable light transmittance. As a result, a dispersion ratio of outputs of the photo-detector is drastically decreased from 15% to 4.2%.

Apart from the above-mentioned embodiment wherein mixture of two materials are varied to make several transmittances of light, another embodiment may be such that variation of transmittance is presented by selecting color, thickness, or surface finishing of the window pane member 7.

Although an output of the photo-detector 100 is measured after semi-completion of assembly in the above-mentioned embodiment, alternatively the measurement may be carried out for the photosensitive semiconductor 4 before mounting it on the base member 1.

Figure 2:
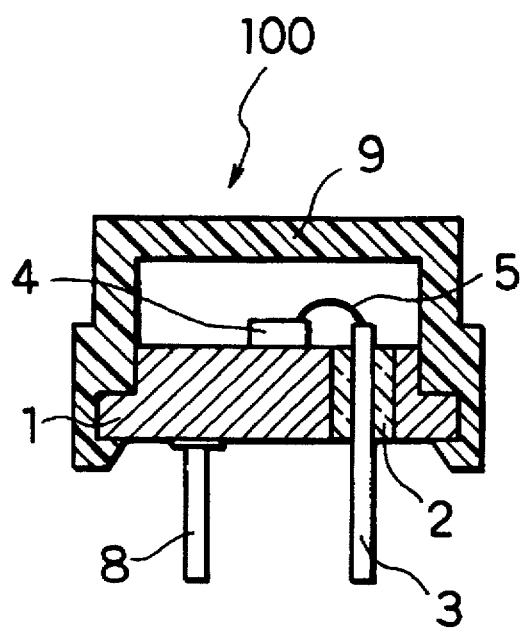
FIG. 2 is a cross-sectional view showing a photo-detector of a resin casing type.

FIG. 2 is a cross-sectional view showing the photo-detector 100 of the resin casing type (type (B)). The base member 1, the glass member 2, the lead 3, the photosensitive semiconductor 4, the gold wire 5 and the lead 8 are the same parts as in FIG. 1, and the description made thereon is similarly applied in this photo-detector 100 too. In FIG. 2, a resin case 9, which has a configuration integrally forming both the cap member 6 and the window pane member 7 in FIG. 1, is mounted on the base member 1 to cover the photosensitive semiconductor 4.

Figure 3:
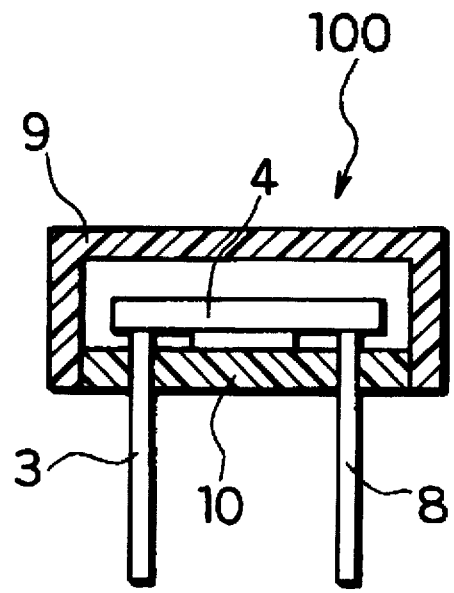
FIG. 3 is a cross-sectional view showing another photo-detector of the resin casing type.

FIG. 3 is a cross-sectional view showing another photo-detector 100 which also belongs to the resin casing type (B). In FIG. 3, the photosensitive semiconductor 4 having a pair of leads 3 and 8 is disposed so as to enter the midway part of the resin case 9, and an opening of the resin case 9 is sealed by a sealing resin member 10.

To vary light transmittances in the above-mentioned photo-detectors 100 shown in FIG. 2 and FIG. 3, several kinds of resin cases 9 having respective light transmittances are provided beforehand, and selection processes similar to those described with reference to FIG. 1 are applied.

Figure 4:
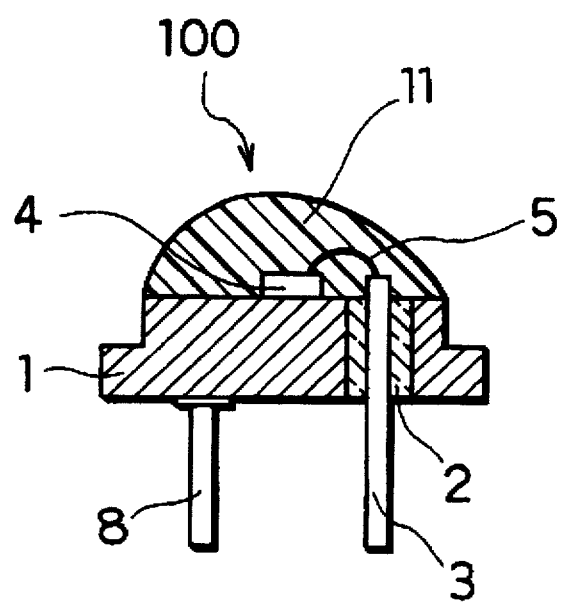
FIG. 4 is a cross-sectional view showing a photo-detector of a resin coated type.

FIG. 4 is a cross-sectional view showing a photo-detector 100 of the resin coated type (type (C)). Since the base member 1, the glass member 2, the lead 3, the photosensitive semiconductor 4, the gold wire 5 and the lead 8 are the same parts as shown in FIG. 1, the description thereon made is similarly applied in this photo-detector 100. In FIG. 4, the photosensitive semiconductor 4 is covered with a resin coating member 11.

Figure 5:
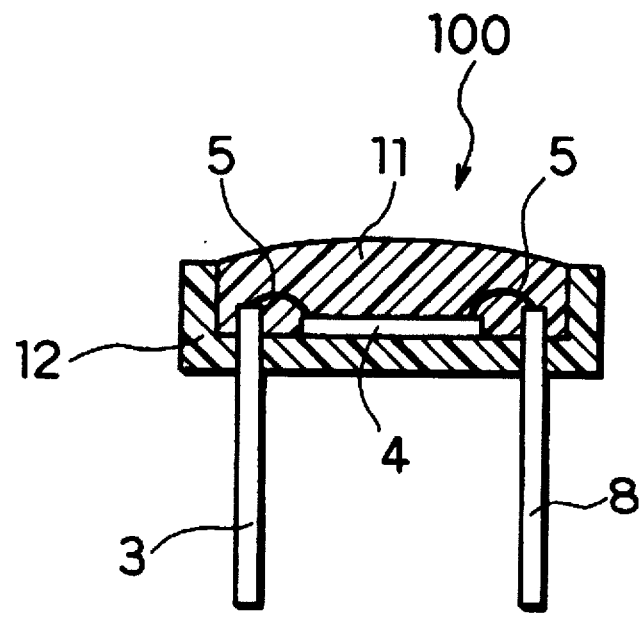
FIG. 5 is a cross-sectional view showing another photo-detector of the resin coated type.

FIG. 5 is a cross-sectional view showing another photo-detector which belongs to the resin coated type (C). In FIG. 5, the photosensitive semiconductor 4 is mounted on a case 12 made of ceramic, resin or metal. Both ends of the photosensitive semiconductor 4 are connected to the leads 3 and 8 via the gold wires 5, respectively. The photosensitive semiconductor 4 is covered with the resin coating member 11.

To vary light transmittances in the above-mentioned photo-detectors 100 shown in FIG. 4 and FIG. 5, several kinds of resin coating materials for forming the resin coating member 11 having respective light transmittances are provided beforehand, and selection processes similar to those described with reference to FIG. 1 are applied.

Figure 6:
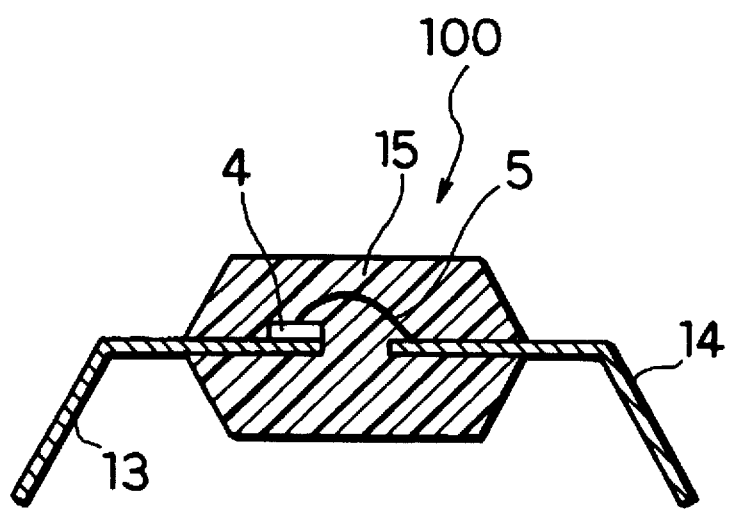
FIG. 6 is a cross-sectional view showing a photo-detector of a resin molded type.

FIG. 6 is a cross-sectional view showing a photo-detector 100 of the resin molded type (type (D)). In FIG. 6, the photosensitive semiconductor 4 is mounted on a lead frame 13, and one end of the photosensitive semiconductor 4 is electrically connected thereto. The other end of the photosensitive semiconductor 4 is connected to the other lead frame 14 via the gold wire 5. The photosensitive semiconductor 4, the gold wire 5, and parts of the lead frames 13 and 14 are molded with resin, thereby forming a resin molded member 15.

To vary light transmittances in the above-mentioned photo-detectors 100 shown in FIG. 6, several kinds of resin coating material for forming the resin molded member 15 having respective light transmittances are provided beforehand, and selection processes similar to those described with reference to FIG. 1 are applied.

Figure 7:
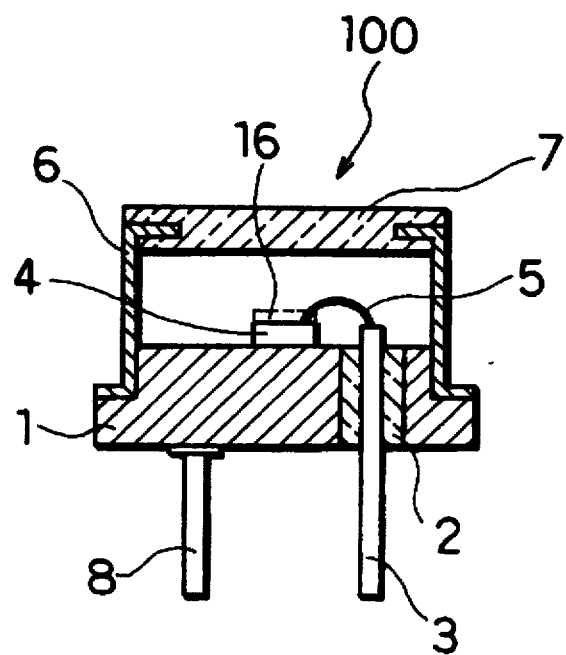
FIG. 7 is a cross-sectional view showing another photo-detector of the housing type.

FIG. 7 is a cross-sectional view showing another photo-detector 100 which is a variation of the housing type (type (A)) photo-detector 100 as shown in FIG. 1. Differences between this photo-detector 100 and the one shown in FIG. 1 are the window pane member 7 and a resin coating member 16. In FIG. 7, the resin coating member 16 is provided to protect the photosensitive semiconductor 4 and a part of the gold wire 5. In this type photo-detector 100, the window pane member 7 has a light transmittance equal to that in the prior art. For example, the light transmittance is the maximum value nearly equal to 100%.

To vary light-transmittances, several kinds of resin coating materials for forming the resin coating member 16 having respective light transmittances are provided beforehand, and selection processes similar to that described with respect to the window pane member 7 in FIG. 1 are applied. By selectably changing the coating material for the resin coating member 16, output of the photo-detector 100 is kept within a uniform range, even when output currents of the respective photosensitive semiconductors 4 have greatly scattered, in the similar way to the case that the window pane members are selected.

Figure 8:
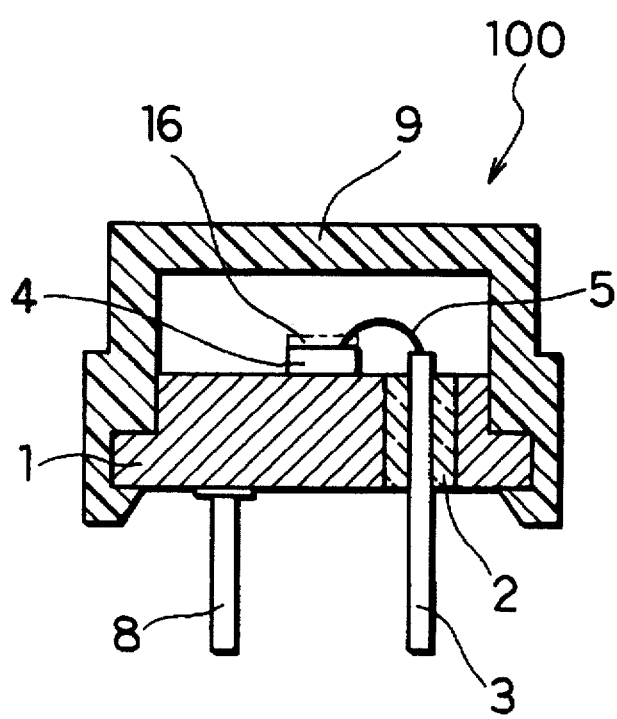
FIG. 8 is a cross-sectional view showing another photo-detector of the resin casing type.

FIG. 8 is a cross-sectional view showing another photo-detector 100 which is a variation of the resin casing type (type (B)) photo-detector 100 as shown in FIG. 2. Differences between this photo-detector 100 and the one shown in FIG. 2 are of the resin case 9 and the resin coating member 16. The above-mentioned description made on FIG. 7 is similarly applied to this type photo-detector 100 in FIG. 8. That is, the resin case 9 has a light transmittance equal to that in the prior art. For example, the light transmittance is the maximum value nearly equal to 100%.

To vary light transmittances, several kinds of resin coating materials for forming the resin coating member 16 having respective light transmittances are provided beforehand, and selection processes similar to those described with respect to the window pane member 7 in FIG. 1 are applied. By selecting the coating material for the resin case 16, output of the photo-detector 100 is kept within a uniform range, even when output currents of the respective photosensitive semiconductors 4 have greatly scattered, in the similar way to the case that the window pane members are selected.

Figure 9:
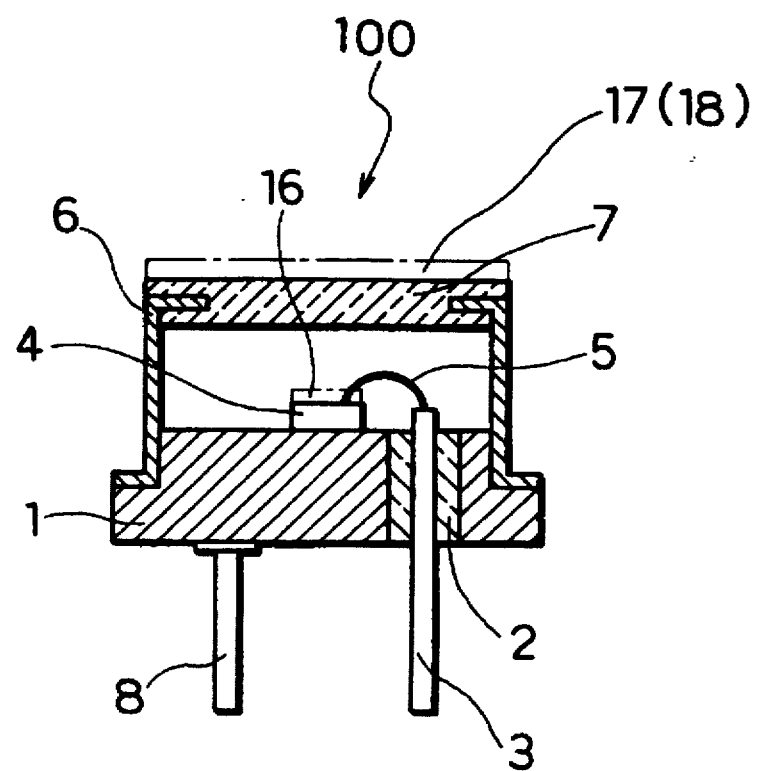
FIG. 9 is a cross-sectional view showing a still other photo-detector of the housing type.

FIG. 9 is a cross-sectional view showing another photo-detector 100 which is a variation of the housing type (type (A)) photo-detector 100 as shown in FIG. 1 and FIG. 7. Differences of this photo-detector 100 from the ones shown in FIG. 1 and FIG. 2 are material of the coating member 16 and additional provision of a coating material 17 (or a sheet 18). In this type photo-detector 100, the window pane member 7 has a light transmittance equal to that in the prior art, and the coating member 16 is only one kind having a light transmittance of a given value.

To vary light transmittances as a whole of the photo-detector 100, several kinds of coating materials 17 (or sheets 18) having respective light transmittances are provided beforehand, and selection processes similar to those described with respect to the window pane member 7 in FIG. 1 are applied. By selecting the coating materials 17 (or the sheets 18), output of the photo-detector 100 is kept within a given or uniform range as a whole even when output currents of the respective photosensitive semiconductors 4 have greatly scattered.

Apart from the above-mentioned photo-detector as shown in FIG. 9, another photo-detector lying under the same concept may be realized by changing a way for covering the window pane member 7 or the photosensitive semiconductor 4 with the following specific configuration of the coating material 17 (or the sheet 18). That is, after completion of measurement of the output characteristic of the photo-detector whose assembly is unfinished, painting manner of the coating member 17 is decided in compliance with the output characteristic. For example, areas on the window pane member 7 on which the coating member 17 should be painted and areas except the above-mentioned area are decided. More specifically, the coating member 17 is formed to have spotted patterns, or a shape of the sheet 18 is changed by forming many small openings in the sheet 18. In a word, quantity of light given to the photosensitive semiconductor 4 is adjusted by varying a covering density for the light-transmitting parts, thereby reducing degree of scattering of the output current in the photo-detector 100.

The above-mentioned method for reducing amount of light transmittance by changing patterns of the coating member 17 (or the filter 18) is also applicable to other type photo-detector. For example, the above-mentioned method can be applied to the resin case 9 (FIG. 2 and FIG. 3), the resin molded member 11 (FIG. 4 and FIG. 5), or the resin molded member 15 (FIG. 6) similarly to the above-mentioned case described with reference to FIG. 9. By covering at least a face of one member for transmitting light with the coating member 17 (or the sheet 18) or an equivalent thereto, scatter of the output of the photo-detector can be reduced.

Apart from the above-mentioned photo-detectors wherein a quantity of light is adjusted by changing mixture of the materials or by changing pattern of the light transmitting materials, another photo-detector may be such that variation of transmittance is presented by selecting color, thickness, or surface finishing of the member for transmitting light.

Also, in FIG. 9, instead of the configuration wherein the window pane member 7 is covered with the coating member 17 (or the filter 18), the photosensitive semiconductor 4 may be covered with any of the coating member or the filter, thereby obtaining the same effect as described with reference to FIG. 9.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

What is claimed is:

1. A method for fabricating a photo-detector comprising the steps of:

mounting a photosensitive semiconductor on a base means and making an electrical connection with a pair of leads;

preparing a plurality of light-transmitting members having light transmittances different from each other;

measuring the intensity of the output of said photosensitive semiconductor under a predetermined quantity of light incident on said photosensitive semiconductor;

selecting one of said light-transmitting members in accordance with said intensity of the output of the photosensitive semiconductor; and disposing said selected one of the light-transmitting members to cover said photosensitive semiconductor.

2. A method for fabricating a photo-detector comprising the steps of:

preparing a plurality of light-transmitting members having light transmittances different from each other;

measuring the intensity of the output of a photosensitive semiconductor under a predetermined quantity of light incident on said photosensitive semiconductor;

selecting one of said light-transmitting members in accordance with said intensity of the output of the photosensitive semiconductor;

mounting said photosensitive semiconductor on a base means and making an electrical connection with a pair of leads; and disposing said selected one of the light-transmitting members to cover said photosensitive semiconductor.

* * * * *